United States Patent
Wu et al.

(10) Patent No.: US 8,071,478 B2
(45) Date of Patent: Dec. 6, 2011

(54) METHOD OF DEPOSITING TUNGSTEN FILM WITH REDUCED RESISTIVITY AND IMPROVED SURFACE MORPHOLOGY

(75) Inventors: Kai Wu, Palo Alto, CA (US); Amit Khandelwal, Cupertino, CA (US); Averginos V. Gelatos, Redwood City, CA (US)

(73) Assignee: Applied Materials, Inc., Santa Clara, CA (US)

(*) Notice: Subject to any disclaimer, the term of this patent is extended or adjusted under 35 U.S.C. 154(b) by 184 days.

(21) Appl. No.: 12/637,864

(22) Filed: Dec. 15, 2009

(65) Prior Publication Data

US 2010/0167527 A1    Jul. 1, 2010

Related U.S. Application Data

(60) Provisional application No. 61/141,988, filed on Dec. 31, 2008.

(51) Int. Cl.
*H01L 21/44* (2006.01)
(52) U.S. Cl. .. 438/685; 438/643; 438/680; 257/E21.476
(58) Field of Classification Search .................. 438/643, 438/680, 685; 257/E21.476
See application file for complete search history.

(56) References Cited

U.S. PATENT DOCUMENTS

| | | |
|---|---|---|
| 6,099,904 A | 8/2000 | Mak et al. |
| 6,156,382 A | 12/2000 | Rajagopalan et al. |
| 6,797,340 B2 | 9/2004 | Fang et al. |
| 6,827,978 B2 | 12/2004 | Yoon et al. |
| 6,878,206 B2 | 4/2005 | Tzu et al. |
| 6,884,466 B2 | 4/2005 | Kaloyeros et al. |
| 6,936,538 B2 | 8/2005 | Byun |
| 7,141,494 B2 * | 11/2006 | Lee et al. ............. 438/627 |
| 7,211,144 B2 | 5/2007 | Lu et al. |
| 7,238,552 B2 | 7/2007 | Byun |
| RE40,114 E | 2/2008 | Sandhu |
| 7,405,158 B2 | 7/2008 | Lai et al. |

(Continued)

FOREIGN PATENT DOCUMENTS

WO    WO-03/064724    8/2003

OTHER PUBLICATIONS

International Search Report and Written Opinion for International Application No. PCT/US2009/067997 dated Jul. 28, 2010.

*Primary Examiner* — Angel Roman
(74) *Attorney, Agent, or Firm* — Patterson & Sheridan, L.L.P.

(57) ABSTRACT

A method of controlling the resistivity and morphology of a tungsten film is provided, comprising depositing a first film of a bulk tungsten layer on a substrate during a first deposition stage by (i) introducing a continuous flow of a reducing gas and a pulsed flow of a tungsten-containing compound to a process chamber to deposit tungsten on a surface of the substrate, (ii) flowing the reducing gas without flowing the tungsten-containing compound into the chamber to purge the chamber, and repeating steps (i) through (ii) until the first film fills vias in the substrate surface, increasing the pressure in the process chamber, and during a second deposition stage after the first deposition stage, depositing a second film of the bulk tungsten layer by providing a flow of reducing gas and tungsten-containing compound to the process chamber until a second desired thickness is deposited.

23 Claims, 4 Drawing Sheets

U.S. PATENT DOCUMENTS

| | | |
|---|---|---|
| 2003/0127043 A1 | 7/2003 | Lu et al. |
| 2003/0157760 A1 | 8/2003 | Xi et al. |
| 2003/0198587 A1* | 10/2003 | Kaloyeros et al. ............ 423/409 |
| 2005/0008779 A1 | 1/2005 | Yang et al. |
| 2005/0031786 A1* | 2/2005 | Lee et al. ................. 427/255.28 |
| 2005/0032364 A1 | 2/2005 | Okubo et al. |
| 2008/0227291 A1 | 9/2008 | Lai et al. |
| 2008/0254623 A1 | 10/2008 | Chan et al. |

* cited by examiner

METHOD OF DEPOSITING TUNGSTEN FILM WITH REDUCED RESISTIVITY AND IMPROVED SURFACE MORPHOLOGY

CROSS-REFERENCE TO RELATED APPLICATIONS

This application claims benefit of U.S. provisional patent application Ser. No. 61/141,988, filed Dec. 31, 2008, which is herein incorporated by reference.

BACKGROUND OF THE INVENTION

1. Field of the Invention

Embodiments of the present invention generally relate to a method of tungsten film deposition, and more particularly, a method of forming a tungsten film with reduced resistivity and improved surface morphology.

2. Description of the Related Art

The semiconductor processing industry continues to strive for larger production yields while increasing the uniformity of layers deposited on substrates having larger surface areas. These goals, in combination with new materials, have led to higher integration of circuits per unit area of the substrate. As circuit integration increases, so does the need for greater uniformity and process control regarding thicknesses of layers deposited on substrates. As a result, various technologies are being developed to deposit layers on substrates in a cost-effective manner, while maintaining control over the characteristics of the layer.

Formation of film layers at a high deposition rate while providing adequate step coverage are conflicting characteristics in which one characteristic is oftentimes obtained at the expense of the other. This conflict is true particularly when refractory metal layers are deposited over gaps or vias during the formation of contacts interconnecting adjacent metallic layers separated by dielectric layers. Historically, CVD techniques have been employed to deposit conductive material such as refractory metals in order to inexpensively and quickly form contacts. With the increasing integration of semiconductor circuitry, tungsten has become a metal of choice due to its superior step coverage.

There are, however, several disadvantages to depositing tungsten by traditional CVD methods. Tungsten films are typically composite films comprising a thin tungsten nucleation layer (having a thickness of, e.g., about 50 angstrom (Å) to about 150 Å) and a thicker bulk tungsten layer (having a thickness of, e.g., about 500 Å to about 2000 Å) formed thereover. Tungsten films comprised of a thin tungsten nucleation layer and a thick bulk tungsten layer tend to have poor film morphology. Use of tungsten has frustrated photolithography steps during the manufacturing process as it results in a relatively rough surface having a reflectivity of 70% or less than that of silicon (thickness and wavelength dependent). Also, tungsten has proven difficult to deposit uniformly, and poor surface uniformity typically increases film resistivity.

Traditional tungsten bulk deposition processes applying continuous flows of tungsten-containing gas, such as tungsten hexafluoride ($WF_6$), and reducing gas, such as hydrogen ($H_2$), on a tungsten nucleation layer are able to achieve low resistivity but result in high surface roughness. Low resistivity is desired for better transistor device speed and low surface roughness is desired to facilitate the formation of photoresists for etching. Low resistivity tungsten is required for bitline in memory and contact in logic application. For the Reactive Ion Etch (RIE) bitline process, both low resistivity and good morphology are required.

Therefore, a need exists in the art for a method of forming tungsten films having both good film morphology and reduced resistivity.

SUMMARY OF THE INVENTION

The present invention generally relates to a method of tungsten film deposition, and more particularly, a method of forming a tungsten film with reduced resistivity and improved surface morphology. In one embodiment, a method of controlling the resistivity and morphology of a tungsten film is provided, comprising (a) positioning a substrate in a process chamber, (b) during a first deposition stage, depositing a first film of a bulk tungsten layer by (i) introducing a continuous flow of a reducing gas and a pulsed flow of a tungsten-containing compound to the process chamber to deposit tungsten on a surface of the substrate, (ii) flowing the reducing gas without flowing the tungsten-containing compound into the chamber to purge the chamber, and (iii) repeating steps (i) through (ii) until the first film fills vias in the substrate surface, (c) increasing the pressure in the process chamber, and (d) during a second deposition stage after the first deposition stage, depositing a second film of the bulk tungsten layer by introducing a continuous flow of reducing gas and tungsten-containing compound to the process chamber until a second desired thickness is deposited.

In another embodiment, a method of controlling the resistivity and morphology of a tungsten film is provided, comprising (a) positioning a substrate in a process chamber, (b) during a first deposition stage, depositing a first film of a bulk tungsten layer by (i) introducing a continuous flow of a reducing gas and a pulsed flow of a tungsten-containing compound to the process chamber to deposit tungsten on a surface of the substrate, (ii) flowing the reducing gas without flowing the tungsten-containing compound into the chamber to purge the chamber, and (iii) repeating steps (i) through (ii) until the first film fills vias in the substrate surface, (c) increasing the pressure in the process chamber, and (d) during a second deposition stage after the first deposition stage, depositing a second film of the bulk tungsten layer by introducing a continuous flow of reducing gas and tungsten-containing compound to the process chamber at a lower ratio of reducing gas to tungsten-containing compound than in the first deposition stage until a second desired thickness is deposited.

In yet another embodiment, a method of controlling the resistivity and morphology of a tungsten film is provided, comprising positioning a substrate in a process chamber, (b) introducing a continuous flow of a reducing gas and a pulsed flow of a tungsten-containing compound to the process chamber to deposit tungsten on a surface of the substrate, wherein the ratio of the flow of reducing gas to the flow of tungsten-containing compound is between 25:1 and 50:1, (c) flowing the reducing gas without flowing the tungsten-containing compound into the chamber to purge the chamber, and (d) repeating steps (b) through (c) until a tungsten bulk layer of desired thickness is deposited.

BRIEF DESCRIPTION OF THE DRAWINGS

So that the manner in which the above recited features of the embodiments of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention

DETAILED DESCRIPTION

Embodiments of the present invention provide an improved process for depositing tungsten films. The process utilizes a pulsed deposition technique and provides tungsten films having significantly improved surface uniformity and morphology. In one aspect, the process includes a two-step deposition method for depositing a tungsten bulk layer which comprises first positioning a substrate in a processing chamber. Next, during a first deposition stage, a first film of the bulk tungsten layer may be deposited by (i) introducing a continuous flow of a reducing gas and a pulsed flow of a tungsten-containing compound to the process chamber to deposit tungsten on a surface of the substrate, (ii) flowing the reducing gas without flowing the tungsten-containing compound into the chamber to purge the chamber, and (iii) repeating steps (i) through (ii) until the first film fills vias in the substrate surface. The pressure in the process chamber may then be increased. During a second deposition stage after the first stage, a second film of said bulk tungsten layer may be deposited by providing a flow of reducing gas and tungsten-containing compound to the process chamber at a lower ratio of reducing gas to tungsten-containing compound than the first deposition stage until a second desired thickness is deposited. In one embodiment, the ratio of reducing gas to tungsten-containing compound in the second deposition stage is lower than in the first deposition stage.

In another aspect, the method of controlling the resistivity and morphology of a tungsten film comprises first positioning a substrate in a processing chamber. Next, a first film of the bulk tungsten layer is deposited by (i) introducing a continuous flow of a reducing gas and a pulsed flow of a tungsten-containing compound to the process chamber to deposit tungsten on a surface of the substrate, wherein the ratio of the flow of reducing gas to the flow of tungsten-containing compound is between 25:1 and 50:1, (ii) flowing the reducing gas without flowing the tungsten-containing compound into the chamber to purge the chamber, and (iii) repeating steps (i) through (ii) until the first film fills vias in the substrate surface.

The method of the present invention may be employed to deposit tungsten films with improved resistivity and surface morphology in a substrate processing chamber, such as the exemplary chemical vapor deposition (CVD) chamber described below. The process is for exemplary purposes and is not intended to limit the scope of the claims of the present invention.

Figure 1:
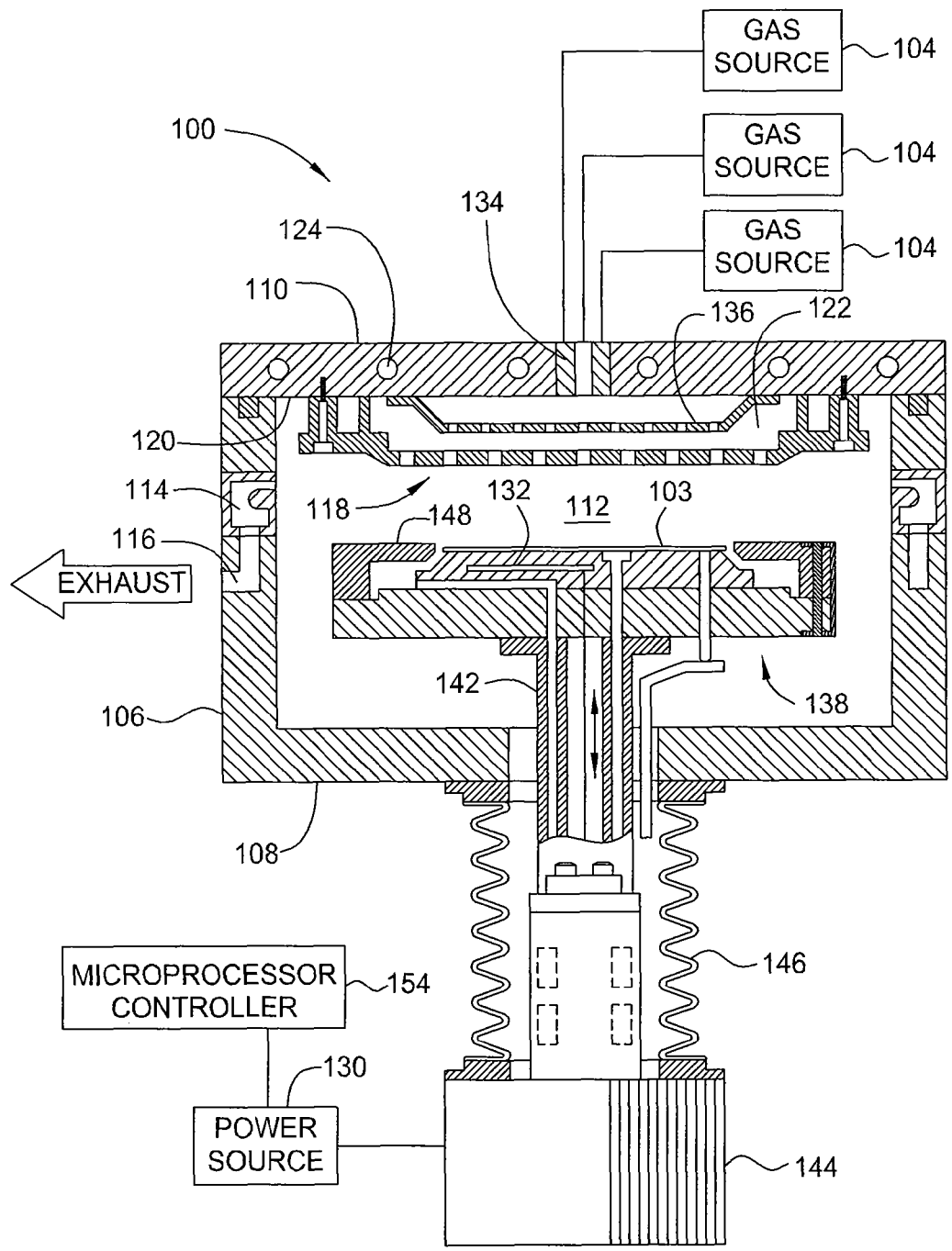
FIG. 1 is a schematic cross-sectional view of a process chamber that can be used to perform a cyclical deposition process according to embodiments described herein.

FIG. 1 is a schematic cross-sectional view of a CVD process chamber 100 that may be used for depositing a tungsten layer according to the embodiments described herein. Such a process chamber 100 is available from Applied Materials, Inc. located in Santa Clara, Calif., and a brief description thereof follows. An integrated processing system capable of performing the nucleation and bulk layer deposition methods described herein is the Centura® tungsten chemical vapor deposition chamber, available from Applied Materials, Inc. located in Santa Clara, Calif.

The process chamber 100 may be part of a processing system (not shown) that includes multiple processing chambers connected to a central transfer chamber (not shown) and serviced by a robot (not shown). The process chamber 100 includes walls 106, a bottom 108, and a lid 110 that define a process volume 112. The walls 106 and bottom 108 are typically fabricated from a unitary block of aluminum. The walls 106 may have conduits (not shown) therein through which a fluid may be passed to control the temperature of the walls 106. The process chamber 100 may also include a pumping ring 114 that couples the process volume 112 to an exhaust port 116 as well as other pumping components (not shown).

A substrate support assembly 138, which may be heated, may be centrally disposed within the process chamber 100. The substrate support assembly 138 supports a substrate 103 during a deposition process. The substrate support assembly 138 generally is fabricated from aluminum, ceramic or a combination of aluminum and ceramic and typically includes a vacuum port (not shown) and at least one or more heating elements 132.

The vacuum port may be used to apply a vacuum between the substrate 103 and the substrate support assembly 138 to secure the substrate 103 to the substrate support assembly 138 during the deposition process. The one or more heating elements 132, may be, for example, electrodes disposed in the substrate support assembly 138, and coupled to a power source 130, to heat the substrate support assembly 138 and substrate 103 positioned thereon to a predetermined temperature.

Generally, the substrate support assembly 138 is coupled to a stem 142. The stem 142 provides a conduit for electrical leads, vacuum and gas supply lines between the substrate support assembly 138 and other components of the process chamber 100. Additionally, the stem 142 couples the substrate support assembly 138 to a lift system 144 that moves the substrate support assembly 138 between an elevated position (as shown in FIG. 1) and a lowered position (not shown). Bellows 146 provide a vacuum seal between the process volume 112 and the atmosphere outside the chamber 100 while facilitating the movement of the substrate support assembly 138.

The substrate support assembly 138 additionally supports a circumscribing shadow ring 148. The shadow ring 148 is annular in form and typically comprises a ceramic material such as, for example, aluminum nitride. Generally, the shadow ring 148 prevents deposition at the edge of the substrate 103 and substrate support assembly 138.

The lid 110 is supported by the walls 106 and may be removable to allow for servicing of the process chamber 100. The lid 110 may generally be comprised of aluminum and may additionally have heat transfer fluid channels 124 formed therein. The heat transfer fluid channels 124 are coupled to a fluid source (not shown) that flows a heat transfer fluid through the lid 110. Fluid flowing through the heat transfer fluid channels 124 regulates the temperature of the lid 110.

A mixing block 134 may be disposed in the lid 110. The mixing block 134 may be coupled to gas sources 104. Generally, individual gas streams from the gas sources 104 may be combined in the mixing block 134. These gases are mixed into a single homogeneous gas flow in the mixing block 134 and introduced into the process volume 112 after passing through a showerhead 118 that diffuses the gas flow outwardly towards the chamber walls 106.

The showerhead 118 may generally be coupled to an interior side 120 of the lid 110. A perforated blocker plate 136 may optionally be disposed in the space 122 between the showerhead 118 and lid 110. Gases (i.e., process and other gases) that enter the process chamber 100 through the mixing block 134 are first diffused by the blocker plate 136 as the gases fill the space 122 behind the showerhead 118. The gases then pass through the showerhead 118 and into the process chamber 100. The blocker plate 136 and the showerhead 118 are configured to provide a uniform flow of gases to the process chamber 100. Uniform gas flow is desirable to promote uniform layer formation on the substrate 103.

In one embodiment, it is desirable for at least one of the lines supplying process gas, such as the tungsten-containing compound gas, from gas sources 104 to process chamber 100 to include a valve (not shown) for diverting gas flow, so that during purging of the process chamber 100 it is not necessary to shut off the mass flow controller (MFC) for the tungsten-containing compound gas source. Diverting the flow of the tungsten-containing compound during purge steps, as opposed to shutting it off, reduces overall throughput time by eliminating the extra time needed for the MFC to stabilize the flow of tungsten-containing compound after each purge step.

The process chamber 100 can be controlled by a microprocessor controller 154. The microprocessor controller may be one of any form of general purpose computer processor or central processing unit (CPU) that can be used in an industrial setting for controlling various chambers and sub-processors. The computer processor may use any suitable memory, such as random access memory, read only memory, floppy disc drive, hard disk, or any other form of digital storage, local or remote. Various support circuits may be coupled to the CPU for supporting the processor in a conventional manner. Software routines, as required, may be stored in the memory or executed by a second CPU that is remotely located.

The software routines are executed after the substrate is positioned on the substrate support. The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Figure 2:
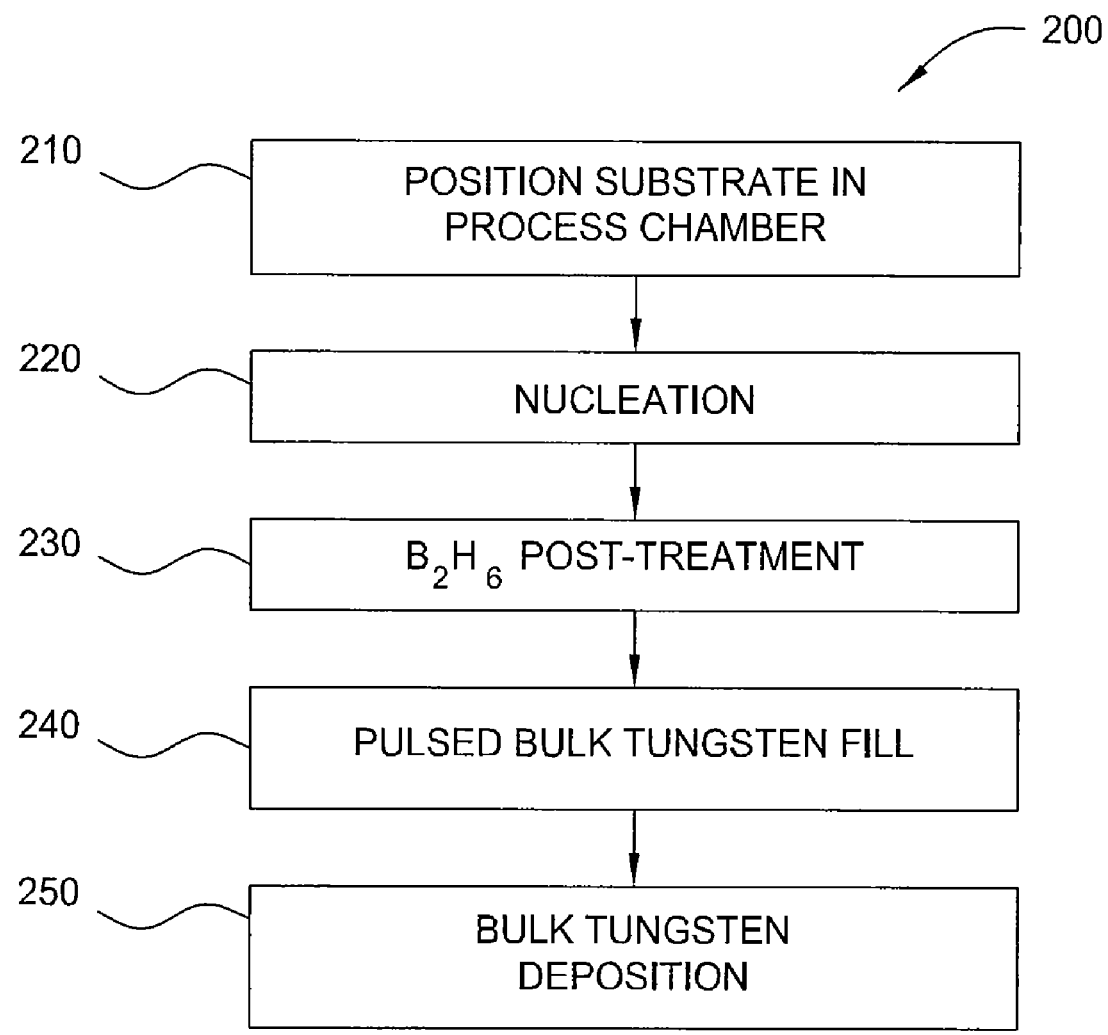
FIG. 2 is a process sequence for tungsten composite film formation according to one embodiment described herein.

FIG. 2 depicts a process flow diagram illustrating an exemplary process sequence 200 for forming an improved tungsten film according to one embodiment of the present invention. As shown in FIG. 2, the tungsten bulk layer deposition process may include two deposition steps or stages. A substrate is first positioned in a processing chamber (see step 210). A nucleation layer is then deposited on a surface of the substrate (see step 220). Following completion of nucleation step 220, the nucleation layer may undergo an optional post-treatment, using a reductant, such as $B_2H_6$ (see step 230). During a first deposition stage, a first bulk tungsten film may be deposited using pulsed chemical vapor deposition (CVD) (see step 240). During a second deposition stage, a second bulk tungsten film may be deposited over the first bulk tungsten film using chemical vapor deposition (CVD) until a desired thickness for the bulk tungsten layer is obtained (see step 250).

Figure 3:
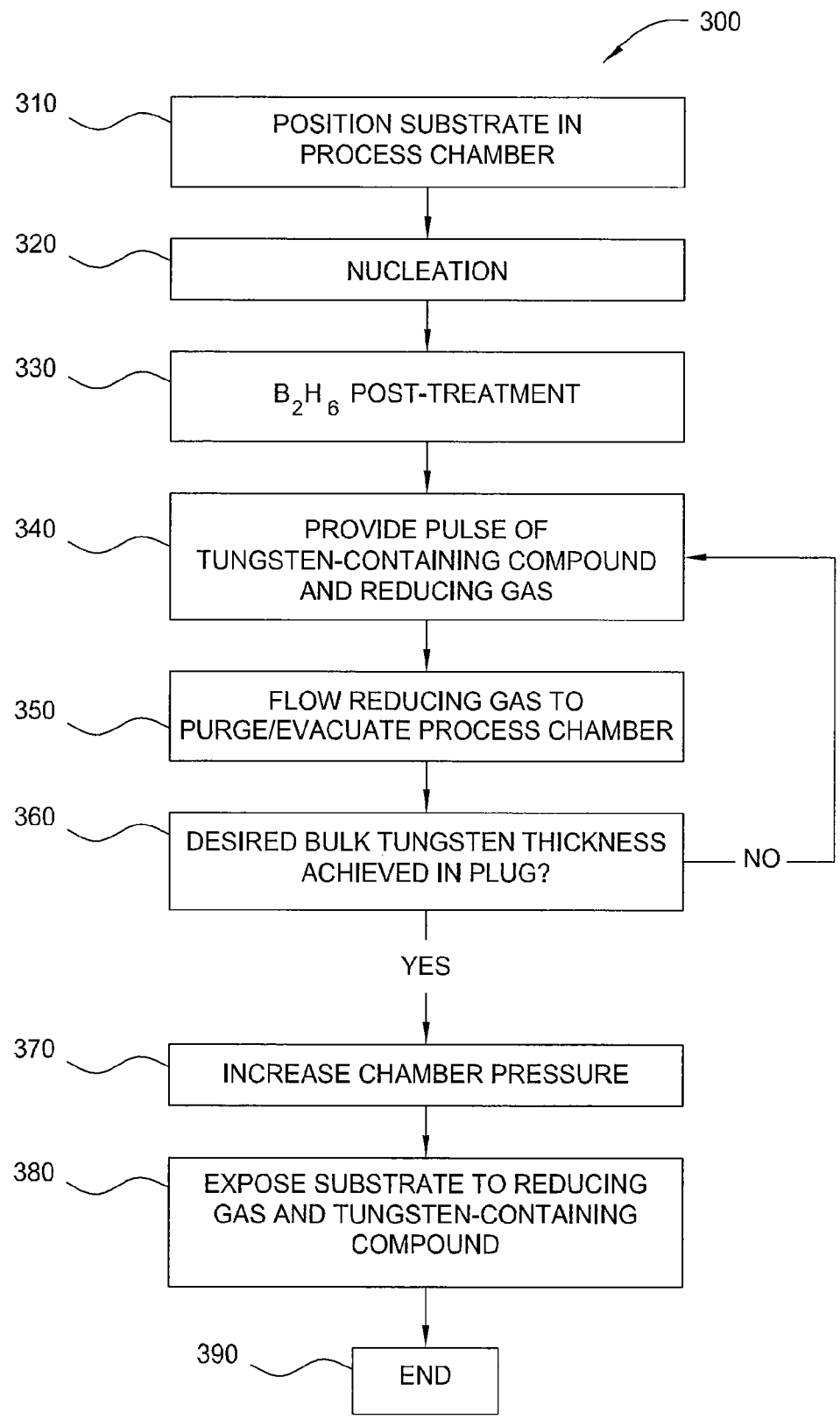
FIG. 3 is a process sequence for tungsten composite film formation according to one embodiment described herein.

FIG. 3 depicts a process flow diagram of one embodiment of the two-stage (pulsed) bulk tungsten deposition process 300 in more detail. A substrate to be processed is first loaded into a process chamber capable of performing pulsed deposition and the process conditions are adjusted (step 310). The substrate may be formed from any material suitable for semiconductor processing, such as silicon, and may have layers formed thereon, such as dielectric or conductive material layers.

A "substrate surface", as used herein, refers to any substrate or material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. A substrate surface may also include dielectric materials such as silicon dioxide and carbon doped silicon oxides. Substrates may have various dimensions, such as 200 mm or 300 mm diameter wafers, as well as rectangular or square panes.

The substrate surface usually contains a barrier layer disposed thereon. Barrier layers usually contain a metal or metal nitride material that includes titanium, titanium nitride, titanium silicon nitride, tantalum, tantalum nitride, tantalum silicon nitride, and combinations thereof. For example, a barrier layer may contain molybdenum titanium nitride (MoTiN). In one embodiment, the barrier layer may be exposed to a soak process prior to tungsten deposition to activate the underlying surface on the substrate, which may include delivering a reducing gas containing a reductant into the process chamber so that the substrate surface forms a treated layer, such as a reduced barrier layer. The barrier layer is reduced and/or adsorbs the reductant to form a conditioned layer for the subsequent nucleation layer. The conditioned barrier layer provides for a quicker and smoother deposition of the nucleation layer. In one example, diborane may be introduced with hydrogen. The diborane and hydrogen gases may be introduced in a 1:1 volumetric ratio. In another example, silane may be introduced with hydrogen. The reducing compounds/reductant for the soak process may include silane, disilane, diborane, hydrogen, and combinations thereof. Preferably, the reductant or soak compound utilized in the soak process is diborane or silane. Processes for pre-soaking prior to deposition of a tungsten nucleation layer are further described in the commonly assigned U.S. Pat. No. 7,405,158, which is incorporated by reference herein.

At step 320, a nucleation layer of desired thickness is deposited on the substrate surface. In one example, the nucleation layer may be formed on the treated barrier layer. The nucleation layer is a thin layer of tungsten which acts as a growth site for subsequent film. The nucleation layer may be deposited by techniques such as atomic layer deposition (ALD), conventional chemical vapor deposition (CVD), or pulsed chemical vapor deposition (CVD). This process may be performed in a CVD process chamber similar to that described above with reference to FIG. 1. The nucleation layer may be deposited in the same process chamber used for the barrier layer soak process. The nucleation layer may comprise tungsten, tungsten alloys, tungsten-containing materials (e.g., tungsten boride or tungsten silicide), and combinations thereof. The nucleation layer is typically deposited to a thickness in a range of about 10 angstroms to about 200 angstroms, or about 50 angstroms to about 150 angstroms. Processes for depositing a tungsten nucleation layer are further described in commonly assigned U.S. Pat. No. 7,405,158.

In one embodiment, after completion of nucleation step 320, a purge gas including hydrogen ($H_2$) and/or argon (Ar) may be pulsed into the processing chamber to remove any residual tungsten-containing precursor or by-products from the nucleation step 320. In another embodiment, after completion of nucleation step 320, the substrate surface may be exposed to a post soak process or a post-treatment in the same or a different process chamber as the nucleation step 320 (see step 330). The post-treatment may contain a reductant and an optional carrier gas. The reductant may adsorb and/or react to the substrate surface, namely the nucleation layer, to form a treated surface for the subsequent bulk layer. The reductants may include silane, disilane, diborane, and hydrogen. In one embodiment, diborane ($B_2H_6$) gas may be flowed into the process chamber for 20 to 30 seconds to form a treated surface on the nucleation layer. Processes for the post-treatment are further described in commonly assigned U.S. Pat. No. 7,405,158. Post-treatment of the nucleation layer will tend to provide a starting layer for the bulk deposition process with a larger grain size and thus a lower resistivity.

Once the desired thickness of the nucleation layer is achieved, and following optional post-treatment of the nucleation layer, a bulk layer is deposited on the substrate surface, namely on the nucleation layer. The bulk layer deposition may take place in the same process chamber used to deposit the nucleation layer. In another embodiment, the nucleation deposition may take place in an ALD chamber, while the bulk deposition may take place in a CVD chamber.

During the first bulk deposition or fill stage, at step 340, the substrate is exposed to a continuous flow of reducing gas, such as hydrogen gas ($H_2$) and a pulse of a tungsten-containing compound, such as tungsten hexafluoride ($WF_6$). In one embodiment, a carrier gas, such as argon (Ar), may be co-flowed with the reducing gas. Suitable carrier gases include helium (He), argon (Ar), nitrogen ($N_2$), and combinations thereof. Following the pulse of the tungsten-containing compound, the reducing gas and the optional carrier gas may continue to flow into the process chamber for a period of time sufficient to purge or otherwise remove any residual tungsten-containing precursor or by-products (step 350).

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. The flow rates given in the examples below correspond to a 300 mm CVD chamber having a volume of about 13,560 cm$^3$.

Referring to step 360, after each deposition cycle (steps 340 through 350) of the first deposition stage, a tungsten bulk layer having a particular thickness will be deposited on the substrate surface. Usually, each deposition cycle forms a bulk tungsten layer having a thickness of about 40 angstroms to 50 angstroms. Depending on specific device requirements, multiple deposition cycles may be needed to deposit additional bulk layers until a first bulk tungsten film having a desired thickness is formed. For example, for a first bulk tungsten film having a target thickness of about 400 angstroms, about eight cycles at a deposition rate of about 50 angstroms/cycle would be necessary. As such, a deposition cycle (steps 340 through 350) can be repeated until the desired thickness for the first bulk tungsten film is achieved.

In one embodiment, it is desirable for the ratio of reducing gas to tungsten-containing compound in the first pulsed bulk deposition step 340 to be high enough to reduce the amount of fluorine impurities in the substrate surface and thus achieve a lower resistivity. For example, the ratio of reducing gas (such as hydrogen gas ($H_2$)) to tungsten-containing compound (such as tungsten hexafluoride ($WF_6$)) in the first fill step 340 may range from about 25:1 to about 60:1, or from about 30:1 to about 50:1. In one example, the ratio of the flow of reducing gas to the flow of tungsten-containing compound may be about 30:1. In some cases, however, it has been observed that the ratio of reducing gas to tungsten-containing compound in the first pulsed bulk deposition step 340 may be too high so that the tungsten deposition occurs too fast, leading to poor gap fill and formation of seams in the gap. This will especially be the case for small structures having plugs with very high aspect ratios, such as 15:1 (height:width). In such instances, however, pulsing of the precursors as shown in steps 340 through 360, as opposed to traditional CVD deposition, may make up for any limits on the ratio of reducing gas to tungsten-containing compound set by the aspect ratio. Pulsed CVD deposition of the first tungsten bulk film tends to result in better plug fill than traditional CVD deposition, yielding a tungsten bulk layer having a lower contact resistivity. Therefore, it may be desirable to adjust the ratio of reducing gas to tungsten-containing compound along with the pulsing frequency and duration in the first bulk tungsten deposition stage depending on the structure and resistivity of the starting substrate surface in order to achieve a tungsten bulk layer of low resistivity. The first bulk deposition stage (steps 340-360), will proceed in a cyclical fashion as described above until features, such as plugs or vias, formed in the substrate surface are filled with tungsten.

In one embodiment, once the plugs are filled with the first bulk tungsten film, a second bulk deposition stage deposits sufficient tungsten on the first bulk tungsten film to achieve a second bulk tungsten film of desired thickness. The bulk tungsten deposition in the second stage may occur at a faster rate than the bulk tungsten deposition in the first stage. Therefore, before commencement of the second bulk tungsten deposition step 380, the process conditions in the chamber are adjusted so that the chamber pressure is increased while the temperature of the pedestal is kept constant (see step 370). The increase in pressure tends to increase the rate at which the tungsten is deposited. During step 370, a purge gas comprising hydrogen ($H_2$) and/or argon (Ar) may flow into the process chamber for a sufficient period of time to remove any residual by-products of the first pulsed bulk layer deposition step. At step 380, a reducing gas, such as hydrogen gas ($H_2$), and a tungsten-containing compound, such as tungsten hexafluoride ($WF_6$), are introduced into the process chamber and are flowed for a sufficient period of time to achieve a target thickness for the second bulk tungsten film. Optionally, a carrier gas such as argon (Ar) may be co-flowed with the reducing gas and the tungsten-containing compound at step 380. Thereafter, when the desired thickness for the final tungsten bulk layer is achieved, the process is stopped as indicated by step 390.

Figure 4:
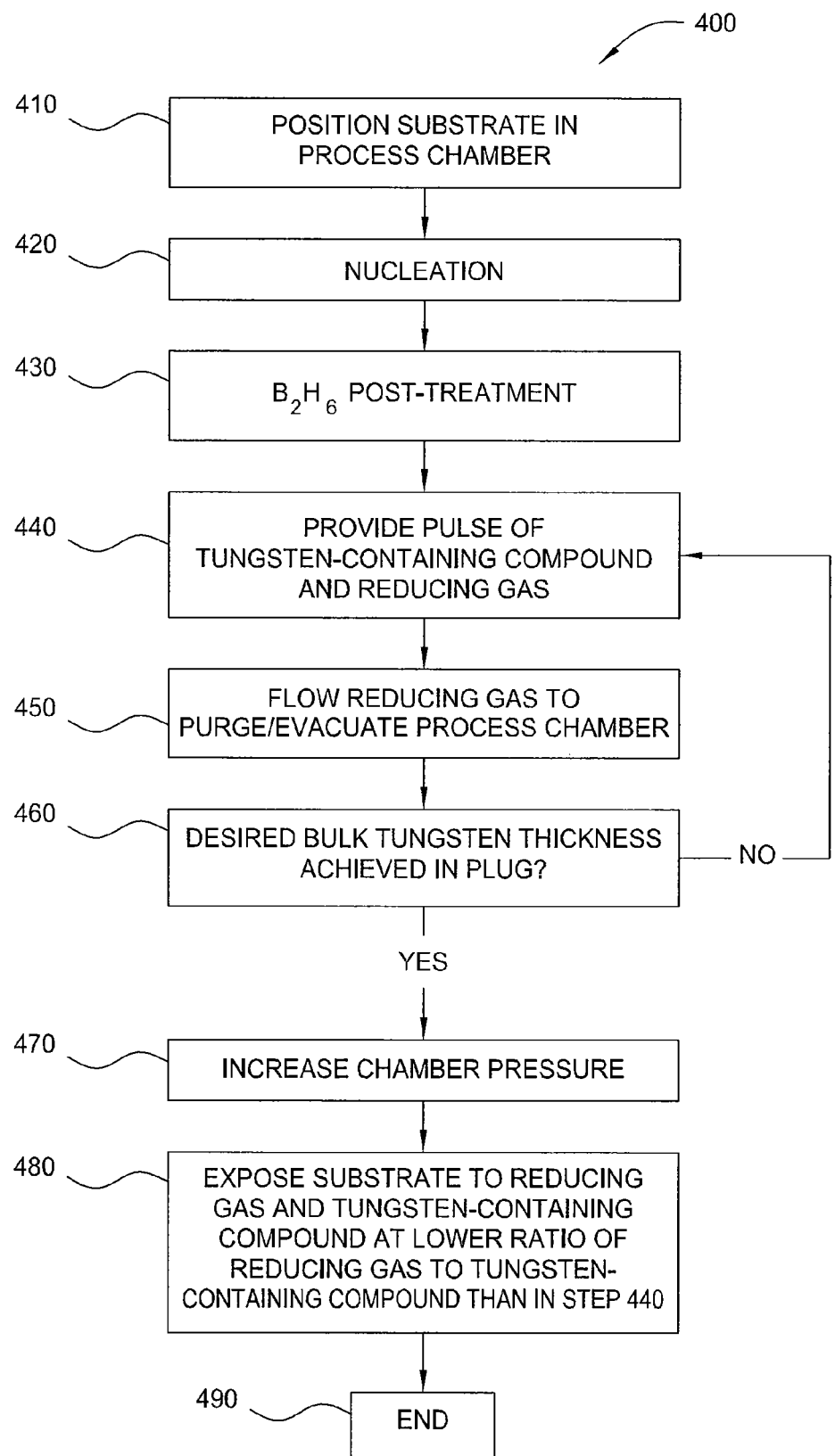
FIG. 4 is a process sequence for tungsten composite film formation according to one embodiment described herein.

FIG. 4 depicts a process flow diagram of an embodiment of the two-stage (pulsed) bulk tungsten deposition process 400 in more detail. The process may be similar to the process discussed above in reference to FIG. 3. As shown in FIG. 4, at step 410, a substrate may be positioned in the process chamber, after which nucleation takes place at step 420. As described above, after completion of nucleation step 420, the substrate surface may be exposed to a post soak process or a post-treatment in the same or a different process chamber as the nucleation step 420 (see step 430).

At step 440, the substrate may be exposed to a continuous flow of reducing gas, such as hydrogen gas ($H_2$) and a pulse of a tungsten-containing compound, such as tungsten hexafluoride ($WF_6$), as described above. In one embodiment, a carrier gas, such as argon (Ar), may be co-flowed with the reducing gas. Suitable carrier gases include helium (He), argon (Ar), nitrogen ($N_2$), and combinations thereof. Following the pulse of the tungsten-containing compound, the reducing gas and the optional carrier gas continue to flow into the process chamber for a period of time sufficient to purge or otherwise remove any residual tungsten-containing precursor or by-products (step 450).

Referring to step 460, after each deposition cycle (steps 440 through 450) of the first bulk deposition stage, a tungsten bulk layer having a particular thickness will be deposited on the substrate surface. Usually, each deposition cycle forms a bulk tungsten layer having a thickness of about 40 angstroms to 50 angstroms. As described above with reference to FIG. 3, depending on specific device requirements, multiple deposition cycles may be needed to deposit additional bulk layers until a first bulk tungsten film having a desired thickness is formed. As such, a deposition cycle (steps 440 through 450) can be repeated until the desired thickness for the first bulk tungsten film is achieved. The first bulk deposition stage (steps 440-460), will proceed in a cyclical fashion as described above until features, such as plugs or vias, formed in the substrate surface are filled with tungsten.

As described above, once the plugs are filled with the first bulk tungsten film, a second bulk deposition stage may then deposit sufficient tungsten on the first bulk tungsten film to achieve a second bulk tungsten film of desired thickness. Before commencement of the second bulk tungsten deposition step 480, the process conditions in the chamber may be adjusted so that the chamber pressure is increased while the temperature of the pedestal is kept constant (see step 470). The increase in pressure tends to increase the rate at which the tungsten is deposited. During step 470, a purge gas comprising hydrogen ($H_2$) and/or argon (Ar) may flow into the process chamber for a sufficient period of time to remove any residual by-products of the first pulsed bulk layer deposition step.

At step 480, a reducing gas, such as hydrogen gas ($H_2$), and a tungsten-containing compound, such as tungsten hexafluoride ($WF_6$), may be introduced into the process chamber and flowed for a sufficient period of time to achieve a target thickness for the second bulk tungsten film. The flow of reducing gas in the second bulk layer deposition step 480 may be smaller than the flow of reducing gas in step 440 of the first deposition stage, and the flow of the tungsten-containing compound in the second deposition step 480 may be larger than the flow of the tungsten-containing compound in step 440 of the first pulsed bulk deposition step, so that the ratio of the reducing gas to tungsten-containing compound is less in the second pulsed bulk deposition step 480 than in the first pulsed bulk deposition step 440. In one embodiment, the ratio of hydrogen gas ($H_2$) to tungsten hexafluoride ($WF_6$) in the first fill step may be 50:1 and the ratio of hydrogen gas ($H_2$) to tungsten hexafluoride ($WF_6$) in the second deposition step may be about 7.5:1.

Optionally, a carrier gas such as argon (Ar) may be co-flowed with the reducing gas and the tungsten-containing compound at step 480. The flow of carrier gas, such as argon (Ar), if present, may also be reduced from the first deposition step to the second deposition step. Thereafter, when the desired thickness for the final tungsten bulk layer is achieved, the process is stopped as indicated by step 490.

In one embodiment, additional streams of carrier and reducing gas may be introduced at other areas of the process chamber during the bulk tungsten layer deposition process so as to avoid deposition or build-up at the edge of the substrate and substrate support assembly, or to purge residual gases. A bottom purge stream of carrier gas, such as argon, may also be introduced into the process chamber in order to prevent deposition on the backside of the heating elements in the process chamber.

In one aspect, following nucleation layer deposition and any subsequent purging or post soak processes, the substrate may be positioned in a 300 mm process chamber having a volume of about 13,560 $cm^3$ and on a pedestal having a temperature in the range of about 100° C. to about 490° C., more preferably in the range of about 300° C. to 430° C. In one example, the temperature may be about 400° C. The pulsed deposition process may be performed with the process chamber at a pressure in the range of about 10 Torr to about 150 Torr, more preferably in the range of about 50 Torr to about 100 Torr. In one example, the pressure may be about 90 Torr. The reducing gas, preferably hydrogen gas ($H_2$), may be introduced at a continuous flow rate between 1,000 sccm and about 8,000 sccm, such as 5,000 sccm. The reducing gas can be introduced with a carrier gas, such as argon (Ar), at a flow rate in the range of about 0 sccm to about 20,000 sccm. In one example, argon may be introduced at a total flow rate of 11,000 sccm. A second flow of argon may be flowed through a purge guide (not shown in FIG. 1) at a rate from about 0 sccm to 2,000 sccm to prevent deposition gases from contacting the edge and backside of the substrate. In one example, the argon edge purge flow may be 500 sccm. Similarly, a second flow of hydrogen gas ($H_2$) may be flowed through a purge guide (not shown in FIG. 1) at a rate from about 0 sccm to 6,000 sccm. In one example, the hydrogen gas edge purge flow may be 2,500 sccm. In another embodiment, an additional flow of carrier gas, such as argon, may be introduced as a bottom purge in order to prevent deposition on the backside of the chamber heating elements. In one example, the argon bottom purge flow may be 5,000 sccm. The tungsten-containing compound may be tungsten hexafluoride ($WF_6$) and may be pulsed at a rate in the range of about 50 sccm to 400 sccm, such as in the range of about 100 sccm to 200 sccm for a time period from about 1 second to 4 seconds. In one example, tungsten hexafluoride ($WF_6$) may be pulsed at a rate of 100 sccm for about 2 seconds. Following the 2 second pulse of tungsten-containing compound, the reducing gas, such as hydrogen gas ($H_2$), and the carrier gas, such as argon (Ar), may continue to flow for about 2 seconds in order to purge the chamber of any reaction byproducts and reduce fluorine impurities on the substrate surface. In the embodiment including argon and hydrogen gas edge purge flows, these may be maintained constant during the purge step 350. In the embodiment including an argon bottom purge flow, the bottom purge flow may be maintained constant during the purge step 350. This pulsed tungsten deposition cycle may continue until plugs or vias in the substrate surface are filled.

In one aspect, after filling the plugs or vias with tungsten using the pulsed bulk deposition method described above, the chamber pressure may be increased to a range of 200 Torr to 300 Torr. In one example, the chamber pressure may be increased to 300 Torr. The flow of reducing gas, preferably hydrogen gas ($H_2$), may be decreased to a range of about 0 sccm to about 4,000 sccm and the flow of carrier gas, such as argon (Ar), may be increased to a range of about 0 sccm to about 20,000 sccm. The reducing gas and carrier gas may flow for a period of time in the range of about 5 seconds to about 10 seconds so as to purge any residual tungsten-containing precursor or by-products from the chamber. In one example, the flow of hydrogen gas ($H_2$) may be decreased from 5,000 sccm (in the first bulk deposition step) to 3,000 sccm and the flow of argon (Ar) is increased from 11,000 sccm (in the first bulk deposition step) to 18,000 sccm and may flow for a duration of about 9 seconds. In the embodiment including argon and hydrogen gas edge purge flows, the argon gas edge flow may be increased to, for example, 1,200 sccm, while the hydrogen gas edge flow may be held constant. In the embodiment including an argon bottom purge flow, the bottom purge flow may be maintained constant. In one embodiment, once any residual tungsten-containing precursor or by-products are purged from the chamber, the argon gas may be introduced at a reduced flow rate of 4,000 sccm, while the 3,000 sccm flow of hydrogen gas may be kept constant for about 3 seconds until the system, including the flow controllers, has stabilized. In the embodiment including argon and hydrogen gas edge purge flows, the edge purge flows may be maintained constant during the stabilization step, such as, for example, 1,200 sccm and 2,500 sccm, respectively. At the second bulk deposition stage, tungsten hexafluoride ($WF_6$) may then be introduced at a flow rate between about 0 sccm to about 400 sccm, while maintaining the hydrogen and argon flows from the stabilization step constant, for a time period between about 0 seconds to about 70 seconds so as to achieve a target thickness for the second bulk tungsten film. In one example, tungsten hexafluoride ($WF_6$) may be introduced at a rate of 400 sccm, along with 3,000 sccm of hydrogen gas and 4,000 sccm of argon, for a period of 28 seconds to achieve a target thickness of 1,500 angstroms for the second bulk tungsten film.

The flow rates of reagents, carrier and purge gas can be scaled according to the size of the substrate and the volume of the process chamber that is being used for deposition.

The two-stage bulk tungsten deposition or via fill method will have advantages over the conventional one-step (non-pulsed) bulk tungsten deposition or via fill process. For example, the tungsten film formed in the vias by the pulsed deposition method may exhibit a reduced fluorine content, in some cases approximately 40% lower, than the traditional non-pulsed interconnect bulk fill. In one example, a substrate having a 30 angstrom nucleation layer deposited thereon by an ALD process using diborane ($B_2H_6$) as the reductant and a bulk tungsten layer deposited over the nucleation layer by the traditional one-step via fill method using 150 sccm $WF_6$, 1,000 sccm $H_2$ and 4,500 sccm Ar at 90 Torr and 400° C. had a resulting tungsten film with a fluorine content of about $1.59 \times 10^{15}$ atoms/cm$^2$. On the other hand, a substrate having a 30 angstrom nucleation layer deposited thereon using an ALD process with diborane ($B_2H_6$) as the reductant and a bulk tungsten layer deposited over the nucleation layer using a pulsed via fill method with 150 sccm $WF_6$, 5,000 sccm $H_2$ and 11,000 sccm Ar at 90 Torr and 400° C. had a resulting tungsten film with a fluorine content of about $9.59 \times 10^{14}$ atoms/cm$^2$, approximately 40% lower than the non-pulsed method film.

The tungsten film deposited using the two-stage (pulsed) deposition method has also been shown to exhibit a reduced resistivity, in some cases about 10% less, than a bulk tungsten film deposited using the traditional one-step (non-pulsed) CVD method. The bulk tungsten layer deposited using the two-stage (pulsed) deposition process also has higher uniformity and better morphology. For example, a substrate having a nucleation layer deposited by five cycles of an ALD process using diborane ($B_2H_6$) as the reductant and a bulk tungsten layer deposited by the traditional one-step fill method using 150 sccm $WF_6$ and 7,500 sccm $H_2$ at 300 Torr and 400° C. exhibited a resistivity of about 14.27 μΩ-cm and a root mean square roughness (RMS) of about 10.19 nm. On the other hand, a substrate having a nucleation layer deposited by five cycles of an ALD process using diborane ($B_2H_6$) as the reductant and a bulk tungsten layer deposited using the pulsed bulk fill method providing pulses of 150 sccm $WF_6$ and a continuous flow of 7,500 sccm $H_2$ at 300 Torr and 400° C., exhibited an improved resistivity of about 12.68 μΩ-cm (approximately 10% lower) and an improved surface morphology of about 8.67 nm RMS.

In one embodiment, the first deposition stage or fill step described above can be used to fill tungsten plugs or vias formed in a dielectric layer which has been deposited on the substrate surface, while the second deposition stage or fill step can subsequently be used to deposit a tungsten bulk layer of a desired thickness thereon. In another embodiment, the second deposition stage or fill step described above can be used to deposit a tungsten bulk layer on the substrate surface which can then be etched prior to deposition of a dielectric layer thereon.

The determination of the thickness of the tungsten bulk layer may be performed using conventional processes such as, for example, spectroscopic measurements. Alternatively, the thickness of the nucleation layer may be estimated by performing a calculation based upon the deposition rate as determined using, for example, various process variables such as flow rates, temperature and pressure.

Example

Following formation using a CVD process of a nucleation layer of desired thickness of about 30 angstroms using $WF_6$ and $B_2H_6$ as reagents on a substrate having vias with a top critical dimension of about 50 nm and about a 4:1 aspect ratio, the substrate was maintained in the CVD chamber and a bulk tungsten layer was deposited using a two-stage deposition or fill method. In the first stage, a first bulk tungsten film was deposited to a thickness of about 500 angstroms in the vias under the following conditions:
Reagents: $WF_6$ and $H_2$;
Pressure: 90 Torr;
Temperature: 400° C.;
Flow rates: 100 sccm $WF_6$ and 5,000 sccm $H_2$;
Pulse Duration: 2 seconds.
The substrate was then maintained in the CVD chamber and the CVD chamber was pressurized to 300 Torr. During pressurization of the chamber, $H_2$ was introduced at a flow rate of 3,000 sccm for about 20 seconds. During the second stage, a bulk tungsten layer was deposited to a thickness of 2,500 angstroms on the substrate surface using a CVD process under the following conditions:
Reagents: $WF_6$ and $H_2$;
Pressure: 300 Torr;
Temperature: 400° C.;
Flow rates: 400 sccm $WF_6$ and 3,000 sccm $H_2$;
Duration: 28 seconds.
The resulting tungsten film exhibited a reduced resistivity compared with a conventional one-step deposition method that does not include a pulsed interconnect bulk fill step.

While the foregoing is directed to embodiments of the present invention, other and further embodiments of the invention may be devised without departing from the basic scope thereof, and the scope thereof is determined by the claims that follow.

The invention claimed is:
1. A method of controlling the resistivity and morphology of a tungsten film, comprising:
 (a) positioning a substrate in a process chamber;
 (b) during a first deposition stage, depositing a first film of a bulk tungsten layer by:

(i) introducing a continuous flow of a reducing gas and a pulsed flow of a tungsten-containing compound to the process chamber to deposit tungsten on a surface of the substrate, (ii) flowing the reducing gas without flowing the tungsten-containing compound into the chamber to purge the chamber, and (iii) repeating steps (i) through (ii) until the first film fills vias in the substrate surface;

(c) increasing the pressure in the process chamber; and (d) during a second deposition stage after the first deposition stage, depositing a second film of the bulk tungsten layer by introducing a continuous flow of reducing gas and tungsten-containing compound to the process chamber until a second desired thickness is deposited.

2. The method of claim 1, further comprising forming a nucleation layer on a surface of the substrate prior to step (b).

3. The method of claim 2, further comprising forming a barrier layer on a surface of the substrate prior to forming the nucleation layer.

4. The method of claim 1, further comprising flowing the reducing gas without flowing the tungsten-containing compound into the chamber during step (c).

5. The method of claim 1, wherein a flow of a carrier gas is co-flowed with the reducing gas in steps (b)(i)-(b)(ii) and (d).

6. The method of claim 4, wherein the carrier gas comprises argon.

7. The method of claim 1, wherein the tungsten bulk layer is deposited by a chemical vapor deposition process.

8. The method of claim 1, wherein the first deposition stage occurs at a pressure of 90 Torr and a temperature of 400° C. and the second deposition stage occurs at a pressure of 300 Torr and a temperature of 400° C.

9. The method of claim 1, wherein the tungsten-containing compound comprises tungsten hexafluoride ($WF_6$) and the reducing gas comprises hydrogen gas ($H_2$).

10. The method of claim 1, wherein the ratio of the flow of reducing gas to the tungsten-containing compound in step (b)(i) is between 25:1 and 50:1.

11. The method of claim 1, wherein the ratio of the flow of reducing gas to the flow of tungsten-containing compound in step (b)(i) is 30:1.

12. A method of controlling the resistivity and morphology of a tungsten film, comprising:

(a) positioning a substrate in a process chamber;

(b) during a first deposition stage, depositing a first film of a bulk tungsten layer by:

(i) introducing a continuous flow of a reducing gas and a pulsed flow of a tungsten-containing compound to the process chamber to deposit tungsten on a surface of the substrate, (ii) flowing the reducing gas without flowing the tungsten-containing compound into the chamber to purge the chamber, and (iii) repeating steps (i) through (ii) until the first film fills vias in the substrate surface;

(c) increasing the pressure in the process chamber; and (d) during a second deposition stage after the first deposition stage, depositing a second film of the bulk tungsten layer by introducing a continuous flow of reducing gas and tungsten-containing compound to the process chamber at a lower ratio of reducing gas to tungsten-containing compound than in the first deposition stage until a second desired thickness is deposited.

13. The method of claim 12, further comprising forming a nucleation layer on a surface of the substrate prior to step (b).

14. The method of claim 12, further comprising forming a barrier layer on a surface of the substrate prior to forming the nucleation layer.

15. The method of claim 12, wherein a flow of a carrier gas is co-flowed with the reducing gas in steps (b)(i)-(b)(ii) and (d).

16. The method of claim 15, wherein the carrier gas comprises argon.

17. The method of claim 12, further comprising exposing the substrate to a reducing gas during a soak process after forming the nucleation layer.

18. The method of claim 12, wherein the first deposition stage occurs at a pressure of 90 Torr and a temperature of 400° C. and the second deposition stage occurs at a pressure of 300 Torr and a temperature of 400° C.

19. The method of claim 12, wherein the ratio of the flow of reducing gas to the flow of tungsten-containing compound in the first deposition stage in step (b)(i) is between 25:1 and 50:1.

20. The method of claim 12, wherein the ratio of the flow of reducing gas to the flow of tungsten-containing compound in the first deposition stage in step (b)(i) is 30:1.

21. The method of claim 12, wherein the tungsten-containing compound comprises tungsten hexafluoride ($WF_6$) and the reducing gas comprises hydrogen gas ($H_2$).

22. The method of claim 14, wherein the tungsten bulk layer is deposited by a chemical vapor deposition process.

23. A method of controlling the resistivity and morphology of a tungsten film, comprising:

(a) positioning a substrate in a process chamber;

(b) introducing a continuous flow of a reducing gas and a pulsed flow of a tungsten-containing compound to the process chamber to deposit tungsten on a surface of the substrate, wherein the ratio of the flow of reducing gas to the flow of tungsten-containing compound is between 25:1 and 50:1;

(c) flowing the reducing gas without flowing the tungsten-containing compound into the chamber to purge the chamber; and (d) repeating steps (b) through (c) until a tungsten bulk layer of desired thickness is deposited.

* * * * *